US010636486B1

(12) United States Patent
Wang et al.

(10) Patent No.: US 10,636,486 B1
(45) Date of Patent: Apr. 28, 2020

(54) RESISTIVE MEMORY AND CONTROL METHOD THEREOF

(71) Applicant: Winbond Electronics Corp., Taichung (TW)

(72) Inventors: Ping-Kun Wang, Tianzhong Township, Changhua County (TW); Shao-Ching Liao, Miaoli County (TW); He-Hsuan Chao, Hsinchu (TW); Chen-Lung Huang, New Taipei (TW); Chi-Ching Liu, Chiayi (TW); Chien-Min Wu, Hsinchu (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/364,375

(22) Filed: Mar. 26, 2019

(51) Int. Cl.
*G11C 11/00* (2006.01)
*G11C 13/00* (2006.01)
*G11C 7/10* (2006.01)

(52) U.S. Cl.
CPC ........ *G11C 13/0097* (2013.01); *G11C 7/1063* (2013.01); *G11C 13/0064* (2013.01)

(58) Field of Classification Search
CPC ......... G11C 11/16; G11C 11/15; H01L 43/03; H01L 27/228
USPC .............................................. 365/158, 189.16
See application file for complete search history.

(56) References Cited

U.S. PATENT DOCUMENTS

| 9,430,372 | B2* | 8/2016 | Nachimuthu | ........... G06F 12/00 |
| 2013/0250654 | A1 | 9/2013 | Sugimae et al. | |
| 2016/0099052 | A1 | 4/2016 | Lee et al. | |
| 2016/0203863 | A1* | 7/2016 | Chien | .................. G11C 13/004 |
| | | | | 714/704 |

FOREIGN PATENT DOCUMENTS

| TW | 280912 B | 7/1996 |
| TW | 201230035 A | 7/2012 |

OTHER PUBLICATIONS

Daniele Lelmini, "Resistive switching memories based on metal oxides: mechanisms, reliability and scaling" Semiconductor Science Technology, May 16, 2016, pp. 1-25, vol. 31.

* cited by examiner

Primary Examiner — Son T Dinh
(74) Attorney, Agent, or Firm — Muncy, Geissler, Olds & Lowe, P.C.

(57) ABSTRACT

A resistive memory including a first storage circuit, a verification circuit, a second storage circuit and a control circuit is provided. The first storage circuit includes various cell groups. Each of the cell groups includes at least one memory cell. The verification circuit is coupled to the first storage circuit to verify whether a specific operation performed on at least one of the memory cells was successful. The second storage circuit includes various flag bits. Each of the flag bits corresponds to a cell group. In a reset period, the control circuit is configured to perform a first reset operation or a second reset operation on a first memory cell of a specific cell group among the cell groups according to a specific flag bit corresponding to the specific cell group.

16 Claims, 4 Drawing Sheets

RESISTIVE MEMORY AND CONTROL METHOD THEREOF

BACKGROUND OF THE INVENTION

Field of the Invention

The invention relates to a storage device, and more particularly to a resistive memory.

Description of the Related Art

The advantage of non-volatile memory is that the data still exists when the power is turned off. Therefore, non-volatile memory is an essential storage component in electrical products allowing the electrical products to maintain normal operation. Resistive memory is a non-volatile memory and is developed in the industry. The resistive memory possess the favorable advantages of having low write operation voltage, short write erase time, long storage time, non-destructive reading, multiple state storage, simple structure and small size. The resistive memory has great application potential in future PCs and electronic devices.

Generally, the resistive memory is required to have an obvious sense window such that the resistive memory has an obvious data discriminability. One conventional method is to apply larger reset voltage to obtain an obvious sense window in a reset operation. However, although the obvious sense window is obtain by continuously applying the larger reset voltage, the deterioration speed of the resistive memory is increased and the endurance of the resistive memory is reduced.

BRIEF SUMMARY OF THE INVENTION

In accordance with an embodiment, a resistive memory comprises a first storage circuit, a verification circuit, a second storage circuit and a control circuit. The first storage circuit comprises a plurality of cell groups. Each of the cell groups comprises at least one memory cell. The verification circuit is coupled to the first storage circuit to verify whether a specific operation performed on at least one of the memory cells was successful. The second storage circuit comprises a plurality of flag bits. Each of the flag bits corresponds to a cell group. The control circuit is coupled to the verification circuit, the first storage circuit and the second storage circuit. Each of the flag bits is initialized in a first flag state. In a reset period, the control circuit is configured to perform a first reset operation or a second reset operation on a first memory cell of a specific cell group among the cell groups according to a specific flag bit corresponding to the specific cell group. In response to the specific flag bit being in the first flag state, the control circuit performs the first reset operation. In response to the specific flag bit being in a second flag state, the control circuit performs the second reset operation.

A control method for a resistive memory is provided. The resistive memory at least comprises a plurality of cell groups and a plurality of flag bits. Each flag bit corresponds to one of the cell groups. An exemplary embodiment of a method for a portable device is described in the following paragraph. A first memory cell of a specific cell group is selected. A determination is made as to whether a specific flag bit corresponding to the specific cell group is in a predetermined flag state. In response to determining that the specific flag bit is in the predetermined flag state, a first reset operation is performed on the first memory cell. In response to determining that the specific flag bit is not in the predetermined flag state, a second reset operation is performed on the first memory cell.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
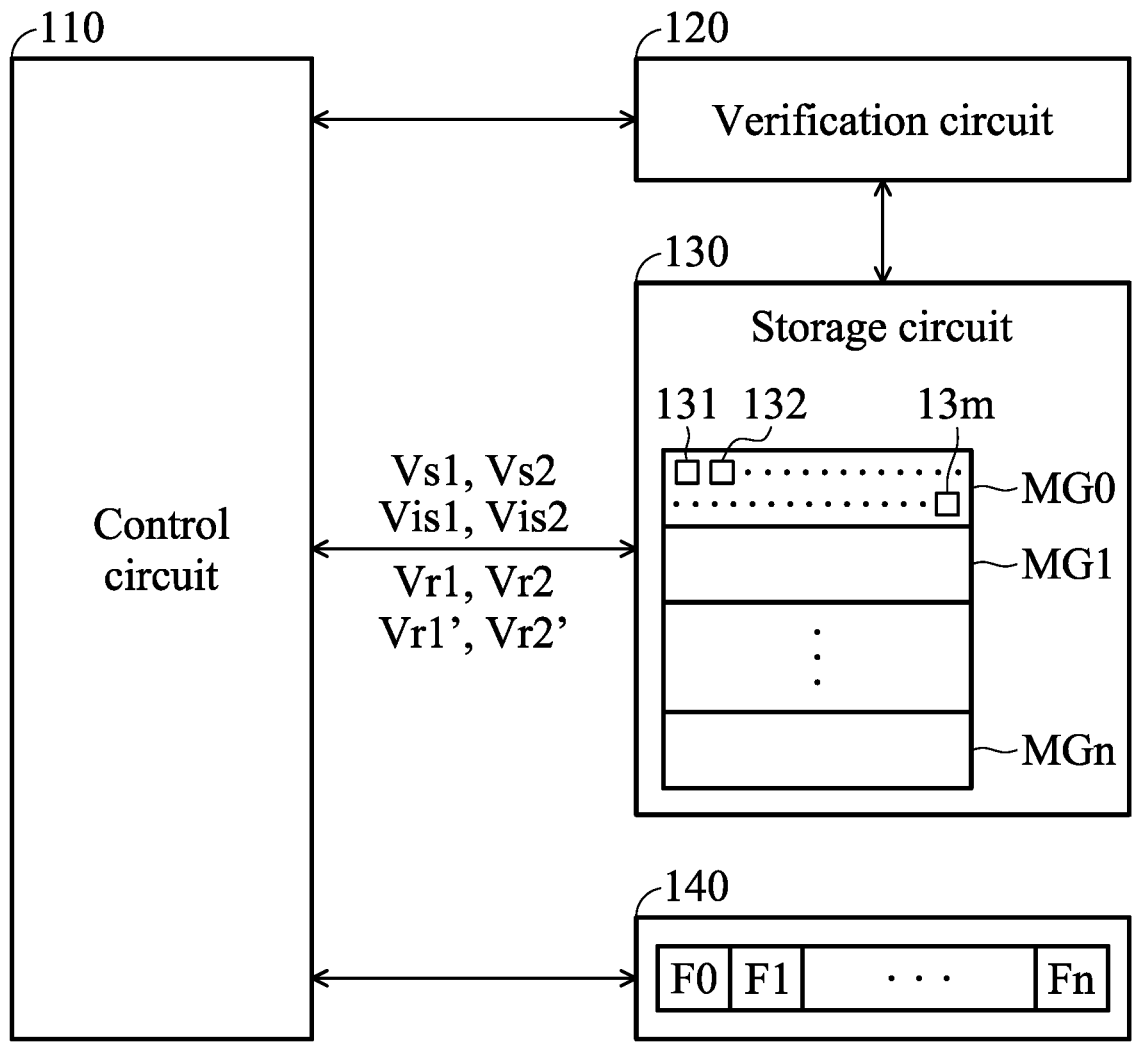
FIG. 1 is a schematic diagram of an exemplary embodiment of a resistive memory, according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention. Additionally, the magnitude of the voltage referred to in the present invention refers to the intensity of the pulse of the voltage, the amplitude of the pulse of the voltage or the width of the pulse of the voltage. For example, when the following describes that a first voltage is substantially larger than a second voltage, this means that the intensity, the amplitude or the width of the voltage pulse of the first voltage is greater than that of the second voltage.

FIG. 1 is a schematic diagram of an exemplary embodiment of a resistive memory, according to various aspects of the present disclosure. As shown in FIG. 1, the resistive memory 100 comprises a control circuit 110, a verification circuit 120 and storage circuits 130 and 140. The storage circuit 130 comprises cell groups MG0~MGn. The cell groups MG0~MGn constitute a memory array. In one embodiment, each of the cell groups MG0~MGn comprises a plurality of memory cells 131~13m. The number of the memory cells of the cell groups MG0~MGn may be equal to each other. For example, each of the cell groups MG0~MGn may comprise thirty-two of the memory cells, but the disclosure is not limited thereto. Each of the cell groups MG0~MGn may comprise more memory cells or fewer memory cells. In another embodiment, the cell groups MG0~MGn may comprise different number of the memory cells. For example, the cell group MG0 may comprise four memory cells, the cell group MG1 may comprise eight memory cells, the cell group MG2 may comprise sixteen memory cells, and so on.

The storage circuit 140 stores flag bits F0~Fn. The flag bits F0~Fn correspond to the cell groups MG0~MGn respectively. For example, the flag bit F0 corresponds to the cell group MG0, the flag bit F1 corresponds to the cell group MG1, the flag bit Fn corresponds to the cell group MGn, and so on. Each of the flag bits F0~Fn is in a first flag state or a second flag state. Taking the flag bit F0 as an example, when the value of the flag bit F0 is a firs value (e.g., 0 or 1), this means that the flag bit F0 is in the first flag state. When the value of the flag bit F0 is a second value (e.g., 1 or 0), this means that the flag bit F0 is in the second flag state. In one embodiment, each of the flag bits F0~Fn is initialized in the first flag state, but the disclosure is not limited thereto. One of ordinary skill in the art is capable of setting the flag bits in multiple flag states according to different designs.

The verification circuit 120 is coupled to the memory cell 130 to perform a verification step. The verification step is to verify whether the execution of a specific operation on one memory cell of the storage circuit 130 was successful and to provide the verification result to the control circuit 110. For example, in one embodiment, when the specific operation is performed on a memory cell of the storage circuit 130, the verification circuit 120 compares the current passing through the memory cell with a predetermined verification current to generate a comparison result and verifies whether the execution of the specific operation performed on the memory cell was successful according to the comparison result. In another embodiment, when a specific operation is performed on a cell group of the storage circuit 130, the verification circuit 120 compares the currents passing through the memory cells of the cell group with a predetermined verification current one-by-one to generate comparison results and to verify whether the specific operation was successfully performed on the cell group according to those comparison results. The disclosure does not limit how the verification circuit 120 reads the currents passing through the memory cells of storage circuit 130. In one embodiment, the verification circuit 120 first provides a current to a specific memory cell of the storage circuit 130, then reads the current passing through the memory cell to generate a read result and compares the read result with a predetermined verification current.

The control circuit 110 is coupled to the verification circuit 120, the storage circuit 130 and the storage circuit 140. In this embodiment, the control circuit 110 applies a suitable voltage (e.g., the set voltage Vs1 or Vs2, the opposite set voltage Vis1 or Vis2, or the reset voltage Vr1, Vr1', Vr2 or Vr2') to the storage circuit 130 according to the verification results of the verification circuit 120. In this embodiment, the control circuit 110 adjusts the flag states of the flag bits F0~Fn according to the verification result of the verification circuit 120.

During a set period, the control circuit 110 performs a set operation on a memory cell (e.g., the memory cell 131) of the storage circuit 130 and utilizes the verification circuit 120 to verify whether the set operation was successfully performed on the memory cell. When the set operation has been successfully performed on the memory cell, the control circuit 110 ends the set operation. When the set operation was not successfully performed on the memory cell, the control circuit 110 continually performs other steps of the set operation and determines whether the set operation was successfully performed or the control circuit 110 determines that the set operation of the memory cell failed and ends the set operation.

In particular, the set operation of the disclosure at least comprises a step of applying a set voltage (e.g., Vs1 or Vs2), a step of applying an opposite set voltage (e.g., Vis1 or Vis2) and multiple verification steps, wherein one of the verification steps is performed each time the set voltage or the opposite set voltage is applied. Taking the set voltage Vs1 and the opposite voltage Vis1 as an example, the phase of the set voltage Vs1 is opposite to the phase of the opposite set voltage Vis1, and the absolute value of the magnitude of the set voltage Vs1 is greater than the absolute value of the magnitude of the opposite set voltage Vis1. In one embodiment, the step of applying the set voltage (e.g., Vs1) may apply a gate voltage to the word line coupled to the memory cell (e.g. the memory cell 131), apply the set voltage Vs1 to the bit line coupled to the memory cell, and apply a ground voltage to the source line coupled to the memory cell. Additionally, the step of applying the opposite voltage Vis1 may apply a gate voltage to the word line coupled to the memory cell (e.g. the memory cell 131), apply the opposite set voltage Vis1 to the source line coupled to the memory cell, and apply a ground voltage to the bit line coupled to the memory cell.

It is worth noting that the step of applying the opposite set voltage (e.g., Vis1 or Vis2) is performed after the verification step verifies that the set operation is not success, wherein the verification step is performed after the set voltage (e.g., Vs1 or Vs2) is applied. It should be further explained that a lot of oxygen ions stuck at the interface between the conducting filament of the memory cell and a top-electrode after the resistive memory performs the step of applying the set voltage. Therefore, the current passing through the memory cell cannot reach the target value after the step of applying the set voltage such that the set operation was not successful. In the disclosure, the step of applying the opposite set voltage is performed when the verification step performed after the step of applying the set voltage verifies that the set operation was not successful. The step of applying the opposite set voltage is to push the oxygen ions away from the interface such that the current passing through the memory cell is effectively increased. However, after the step of applying the opposite set voltage, if the current passing through the memory cell cannot be increased, this means that the memory cell has a tendency to deteriorate.

In one embodiment, it is assumed that a set operation is preformed for a memory cell, such as the memory cell 131. In this case, if the memory cell 131 was successfully set before the verification step which is performed after the step of applying the opposite set voltage, the flag bit (F0) corresponding to the cell group (MG0) having the memory cell 131 is maintained in a first flag state. However, if the memory cell 131 was not successfully set after the verification step which is performed after the step of applying the opposite set voltage Vis1, the control circuit 110 sets the flag bit (F0) corresponding to the cell group having the memory cell 131 in a second flag state. In another embodiment, when the set operation consists various steps of applying the opposite set voltage (e.g., Vis1 or Vis2), the control circuit 110 can be designed to adjust the corresponding flag bit in the second flag state after any one verification step which is performed after the step of applying the opposite set voltage if memory cell was not successfully set.

In a reset period, the control circuit 110 performs different reset operations for a memory cell (e.g., the memory cell 132) according to the flag bit (e.g., F0) corresponding to the cell group (e.g., MG0) having the memory cell 132 and utilizes the verification circuit 120 to determine whether the reset operation performed on the memory cell 132 was successful. When the reset operation was successful, the control circuit 110 ends the reset operation. When the reset operation was not successful, the control circuit 110 continues to perform following steps in the reset operation and determines whether the reset operation performed on the memory cell 132 was successful. The control circuit 110 may end the reset operation if the reset operation was not successful after all the steps of the reset operation were performed.

In one embodiment, when the flag bit is in the first flag state, the control circuit 110 outputs a normal reset voltage (e.g., Vr1) to perform a first reset operation on the memory cell. When the flag bit is in the second flag state, this means that the memory cell starts tending to deteriorate. Therefore, the control circuit 110 outputs a weak reset voltage (e.g., Vr1') to perform a second reset operation on the memory cell to reduce the speed of the deterioration.

In particular, the reset operation of the invention at least comprises a step of applying a reset voltage (Vr1) and at least one verification step which is performed after the step of applying the reset voltage and verifies whether the reset operation was successful. Taking the reset voltage Vr1 as an example, the phase of the reset voltage Vr1 is the same as the phase of the opposite set voltage Vis1, and the absolute value of the magnitude of the reset voltage Vr1 is greater than the absolute value of the magnitude of the opposite set voltage Vis1. In one embodiment, the magnitude of the reset voltage Vr1 is between the opposite set voltage Vis1 multiplied by 4/3 and the opposite set voltage Vis1 multiplied by 2. In one embodiment, the step of applying the reset voltage Vr1 is to apply a gate voltage to the word line coupled to the memory cell (e.g., 132), apply the reset voltage to the source line coupled to the memory cell and apply a ground voltage to the bit line coupled to the memory cell.

Figure 2:
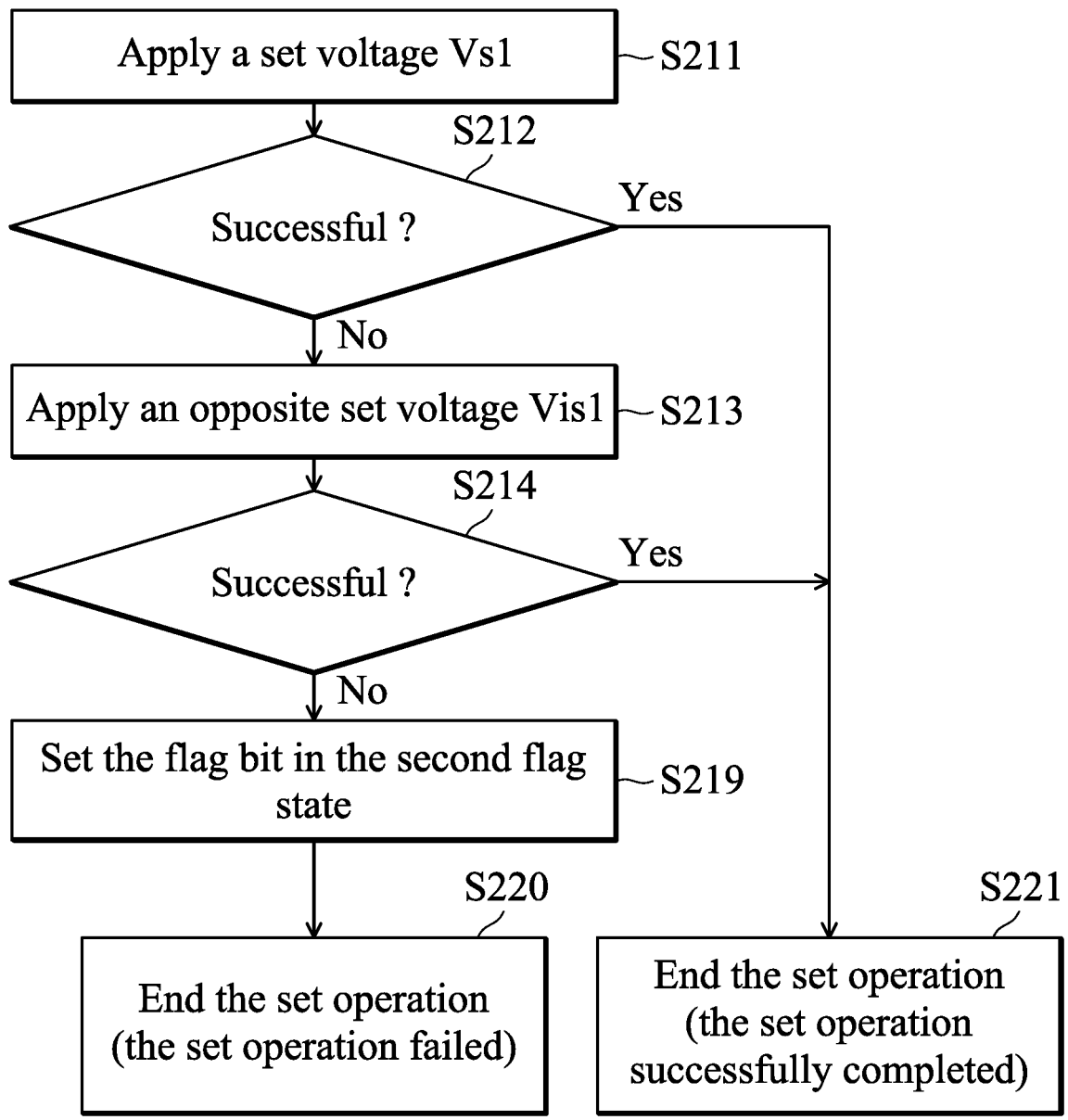
FIG. 2 is a flowchart of an exemplary embodiment of a set method for a resistive memory, according to various aspects of the present disclosure.

FIG. 2 is a flowchart of an exemplary embodiment of a set method for a resistive memory, according to various aspects of the present disclosure. Assume that the control circuit 110 executes a set operation on the memory cell 131. First, the control circuit 110 applies a set voltage Vs1 to the memory cell 131 (step S211). In one embodiment, the set voltage Vs1 is a positive voltage.

Next, the verification circuit 120 executes a verification step to determine whether the set operation was successful (step S212) and provides the determination result to the control circuit 110. In the disclosure, the verification circuit 120 may determine whether the current passing through the memory cell 131 is larger than or equal to a predetermined verification current Ivfy1 to determine whether the set operation was successful. In other words, when the current passing through the memory cell 131 is larger than or equal to the verification current Ivfy1, this means that the set operation was successful. Conversely, when the current passing through the memory cell 131 is smaller than the verification current Ivfy1, this means that the set operation was not successful. At this time, the control circuit 110 may continuously execute the following step of the set operation or determine that the set operation is fail and end the set operation.

When the set operation was successful, the control circuit 110 ends the set operation (step S221). However, when the set operation was not successful, the control circuit 110 applies an opposite set voltage Vis1 to the memory cell 131 (step S213). In one embodiment, the opposite set voltage Vis1 is a negative voltage. In another embodiment, the absolute value of the magnitude of the opposite set voltage Vis1 is smaller than the absolute value of the magnitude of the set voltage Vs1.

Next, the verification circuit 120 performs the verification step again to determine whether the set operation was successful (step S214) and provides the determination result to the control circuit 110. When the set operation was successful, the control circuit 110 ends the set operation (step S221). However, when the verification circuit 120 determines that the set operation was not successful, the control circuit 110 sets the flag bit F0 corresponding to the cell group MG0 comprising the memory cell 131 in the second flag state (step S219). At this time, since a failure may occur at the memory cell 131, the control circuit 110 determines that the set operation is fail and the control circuit 110 ends the set operation (step S220).

In some embodiments, when performing step S219, the control circuit 110 may also continue to perform following steps of the set operation and continue to determine whether the set operation was successful until all steps of the set operation are finished. When all steps of the set operation are finished and the set operation was still not successful, the control circuit 110 performs step S220.

It should be noted that the memory cell 131 or other memory cells (e.g., 132-13m) of the cell group MG0 may tend to deteriorate when the set operation performed on the memory cell 131 was not successful (i.e., step S214 determines that the set operation was not successful) after the step of applying the opposite set voltage Vis1. Therefore, step S219 of the disclosure sets the flag bit F0 corresponding to the cell group MG0 having the memory cell 131 in the second flag state.

Figure 3:
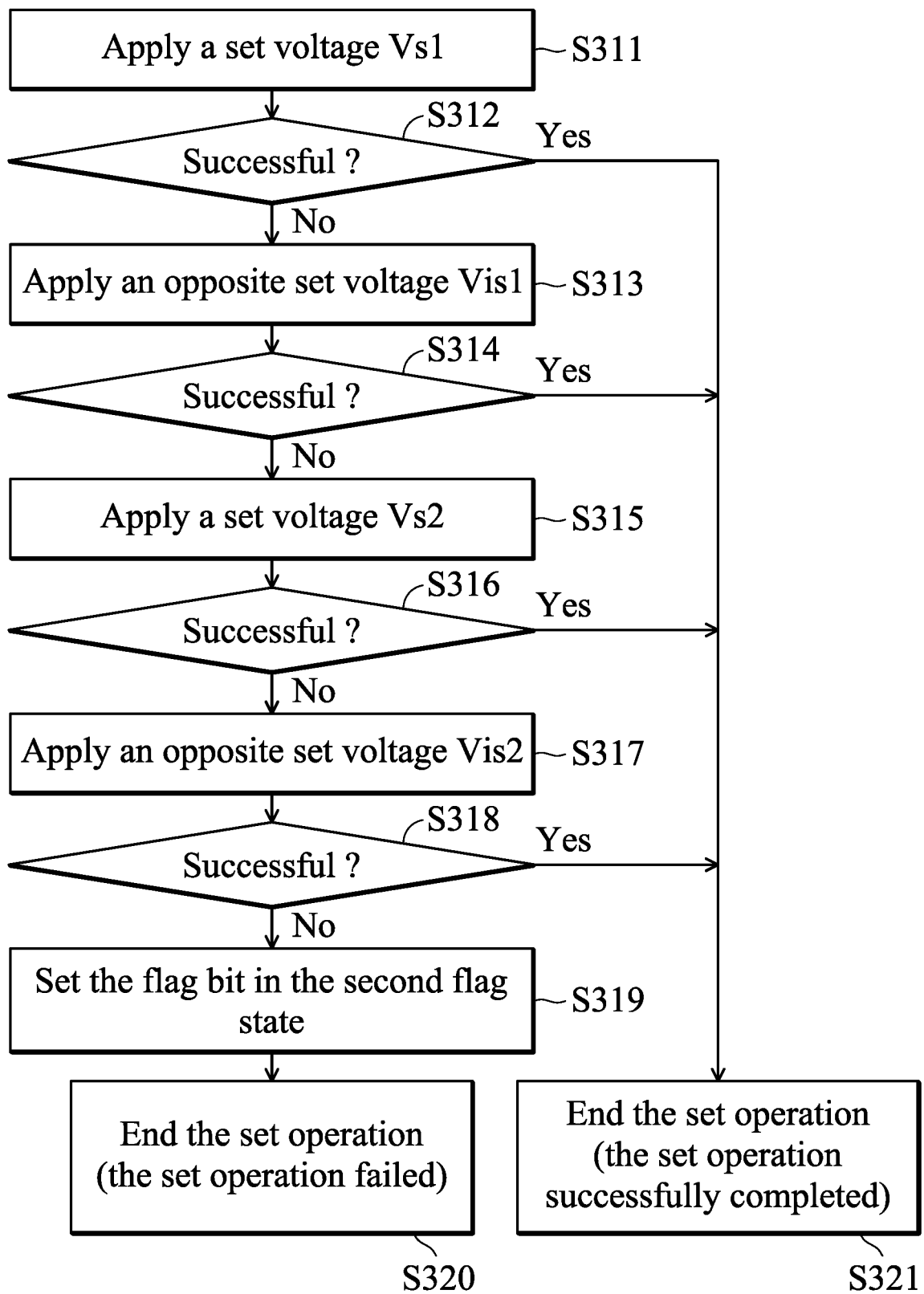
FIG. 3 is a flowchart of another exemplary embodiment of the set method for a resistive memory, according to various aspects of the present disclosure.

FIG. 3 is a flowchart of another exemplary embodiment of the set method for a resistive memory, according to various aspects of the present disclosure. FIG. 3 is similar to FIG. 2 except for the additions of steps S315~S318. Since the features of steps S311~S314 and S319~S321 shown in FIG. 3 are the same as the features of steps S211~S214 and S219~S221 shown in FIG. 2, the descriptions of steps S311~S314 and S319~S321 are omitted.

Referring to FIG. 3, in step S315, when step 314 determines that the set operation was not successful, the control circuit 110 applies the set voltage Vs2 to the memory cell 131. In one embodiment, the set voltage Vs2 is a positive voltage. In another embodiment, the magnitude of the set voltage Vs2 may be the same as or larger than the magnitude of the set voltage Vs1.

Next, the verification circuit 120 performs the verification step to determine whether the set operation was successful (step S316) and provides the determination result to the control circuit 110. When the verification circuit 120 determines that the set operation was successful, the control circuit 110 ends the set operation (step S321). When the verification circuit 120 determines that the set operation was not successful, the control circuit 110 applies an opposite set voltage Vis2 to the memory cell 131 (step S317). In this embodiment, the opposite set voltage Vis2 is a negative voltage. The absolute value of the magnitude of the opposite set voltage Vis2 may be essentially the same as or greater than the absolute value of the magnitude of the opposite set voltage Vis1.

Then, the verification circuit 120 again performs the verification step to determine whether the set operation was successful (step S318). When the verification circuit 120 determines that the set operation was successful, the set operation is ended (step S321). When the verification circuit 120 determines that the set operation was not successful, the control circuit 110 sets the flag bit F0 in the second flag state (step S319). Since the set operation is fail, the control circuit 110 ends the set operation.

In particular, in some embodiments (e.g., the embodiments described in FIG. 3), when the set operation performed on the resistive memory consists many steps of applying opposite set voltage, such as steps S313 and S317, the designer can set the flag bit in the second flag state at any one verification step (e.g., step S314 or S318) which is performed after the step of applying the opposite set voltage according to the different requirements (e.g., the design of the product or the process capability).

Figure 4:
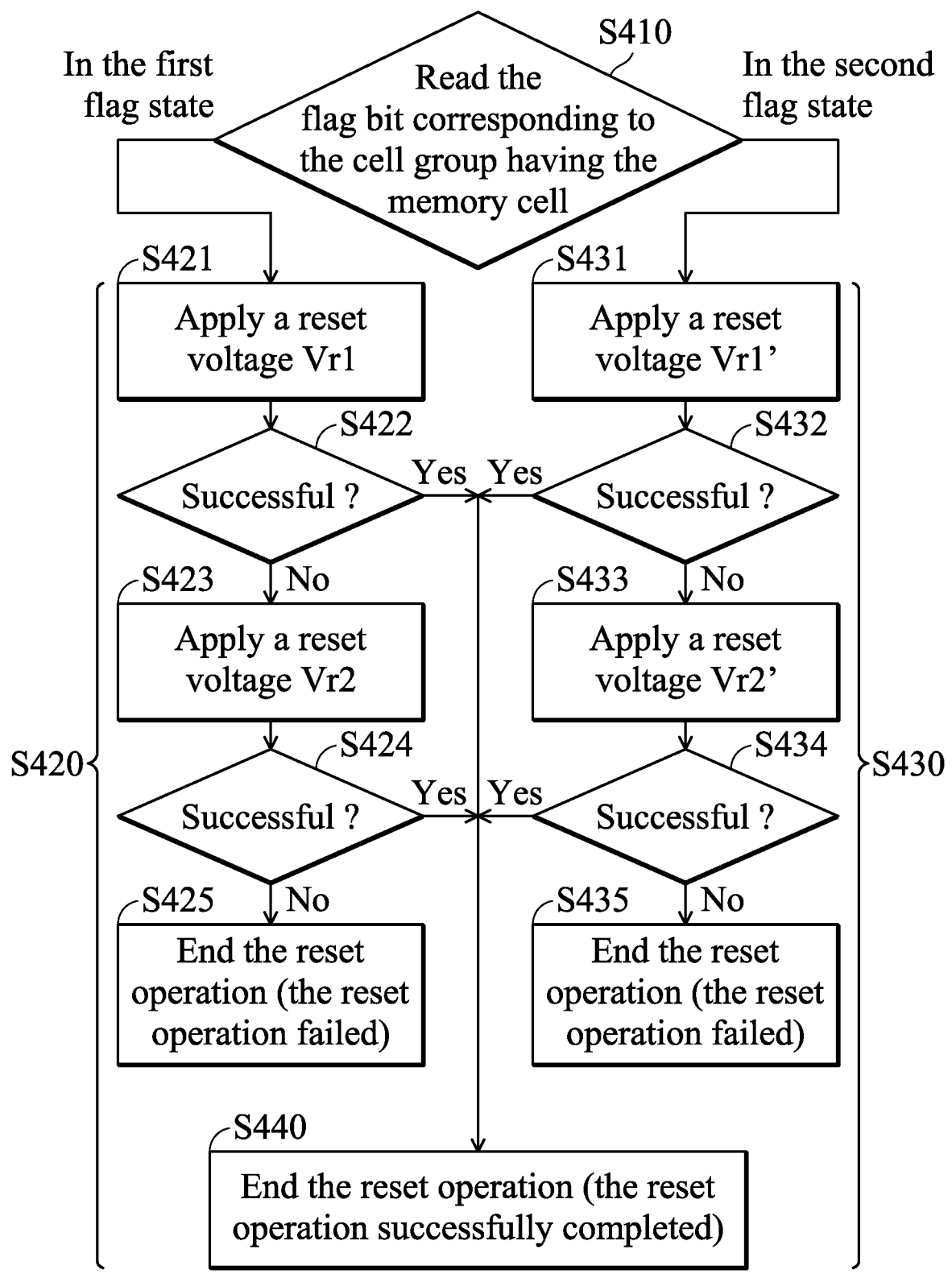
FIG. 4 is a flowchart of an exemplary embodiment of a reset method for a resistive memory, according to various aspects of the present disclosure.

FIG. 4 is a flowchart of an exemplary embodiment of a reset method for a resistive memory, according to various aspects of the present disclosure. In this embodiment, the control circuit 110 performs a first reset operation or a second reset operation on at least one memory cell according to the flag bits F0~Fn. To describe the reset method of the disclosure, it is assumed that the control circuit 110 performs one reset operation on another memory cell 132 of the storage circuit 130, but the invention is not limited thereto. The control circuit 110 can perform the reset operation on the same memory cell 131 of the storage circuit 130.

First, the control circuit 110 reads the flag bit F0 corresponding to the cell group MG0 having the memory cell 132 (step S410). When the flag bit F0 is in the first flag state, this means that the deterioration does not occur in the memory cells 131-13m of the cell group MG0. Therefore, the control circuit 110 performs the first reset operation (step S420) for the memory cell 132. The first reset operation S420 comprises steps S421~S425 and S440.

In step S421, the control circuit 110 applies a reset voltage Vr1 to the memory cell 132. In one embodiment, the reset voltage Vr1 is a negative voltage. In another embodiment, the absolute value of the magnitude of the reset voltage Vr1 is greater than the absolute value of the magnitude of each of the opposite set voltages Vis1 and Vis2. In other embodiments, the magnitude of the reset voltage Vr1 is between the opposite set voltage (e.g. Vis1 or Vis2) multiplied by 4/3 and the opposite set voltage multiplied by 2.

Next, the verification circuit 120 performs a verification step to determine whether the reset operation was successful (step S422) and provides the determination result to the control circuit 110. In the verification step of the disclosure, the verification circuit 120 verifies whether the current passing through the memory cell 132 is less than or equal to a predetermined verification current Ivfy2 to determine whether the reset operation was successful. In other words, when the current passing through the memory cell 132 is less than or equal to the verification current Ivfy2, this means that the reset operation was successful. On the contrary, when the current passing through the memory cell 132 is larger than the verification current Ivfy2, this means that the reset operation was not successful. At this time, the control circuit 110 may continuously perform the following step of the reset operation or determine that the reset operation is fail to end the reset operation.

When the reset operation was successful, the control circuit 110 ends the reset operation (step S440). However, when the reset operation was not successful, the control circuit 110 applies the reset voltage Vr2 to the memory cell 132 (step S423). In one embodiment, the reset voltage Vr2 is a negative voltage. In another embodiment, the absolute value of the reset voltage Vr2 is essentially larger than or equal to the absolute value of the reset voltage Vr1.

The verification circuit 120 again performs the verification step to determine whether the reset operation was successful (step S424) and provides the determination result to the control circuit 110. When the verification circuit 120 determines that the reset operation was successful, the control circuit 110 ends the reset operation (step S440). However, the verification circuit 120 again determines that the reset operation was not successful, this means that the memory cell 132 cannot be reset. Therefore, the control circuit 110 determines that the reset operation is fail and ends the first reset operation (step S425).

Go back to step S410, when the flag bit F0 is in the second flag state, it means the memory cells 131-13m of the cell group MG0 tends to deteriorate. Therefore, the control circuit 110 performs the second reset operation S430 for the memory cell 132. The second reset operation S430 comprises steps S431~S435 and S440.

In step S431, the control circuit 110 applies a reset voltage Vr1' to the memory cell 132. In one embodiment, the reset voltage Vr1' is a negative voltage. The magnitude of the reset voltage Vr1' is essentially less than the magnitude of the reset voltage Vr1.

Next, the verification circuit 120 executes the verification step to determine whether the reset operation was successful (step S432) and provides the determination result to the control circuit 110. When the verification circuit 120 determines that the reset operation was successful, the control circuit 110 ends the reset operation (step S440). However, when the verification circuit 120 determines that the reset operation was not successful, the control circuit 110 applies a reset voltage Vr2' to the memory cell 132 (step S433). In one embodiment, the reset voltage Vr2' is a negative voltage. The magnitude of the reset voltage Vr2' is essentially larger than or equal to the magnitude of the reset voltage Vr1'.

Then, the verification circuit 120 again executes the verification step to determine whether the reset operation was successful (step S434) and provides the determination result to the control circuit 110. When the verification circuit 120 determines that the reset operation was successful, the control circuit 110 ends the reset operation (step S440). However, when the verification circuit 120 again determines that the reset operation was not successful, this means that the memory cell 132 cannot be reset. Therefore, the control circuit 110 ends the second reset operation (step S435).

In the disclosure, when any memory cell of a cell group occurs a deterioration, the control circuit changes the state of the flag bit corresponding to the cell group having the memory cell. Furthermore, the disclosure applies a normal reset voltage to the memory cell of the normal cell group to perform a reset operation and applies a weak reset voltage to the memory cell of the cell group occurring the deterioration to perform the reset operation. Therefore, the endurance, the reliability and the performance of the resistive memory are increased. Additionally, the disclosure does not count the number of times the memory cell performs the reset operation or the set operation to determine whether the memory cell tends to deteriorate such that the power consumption of the resistive memory is reduced and the usable space of the resistive memory is increased.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A resistive memory comprising:
   a first storage circuit comprising a plurality of cell groups, wherein each of the cell groups comprises at least one memory cell;
   a verification circuit coupled to the first storage circuit to verify whether an execution of a specific operation performed on at least one of the memory cells was successful;
   a second storage circuit comprising a plurality of flag bits, wherein each of the flag bits corresponds to a cell group; and
   a control circuit coupled to the verification circuit, the first storage circuit and the second storage circuit,
   wherein each flag bit is initialized in a first flag state,
   wherein in a reset period, the control circuit is configured to perform a first reset operation or a second reset operation on a first memory cell of a specific cell group among the cell groups according to a specific flag bit corresponding to the specific cell group,
   wherein in response to the specific flag bit being in the first flag state, the control circuit performs the first reset operation, and in response to the specific flag bit being in a second flag state, the control circuit performs the second reset operation.

2. The resistive memory as claimed in claim 1, wherein in response to performing the first reset operation, the control circuit applies a first reset voltage to the first memory cell, in response to performing the second reset operation, the control circuit applies a second reset voltage to the first memory cell, and the absolute value of the magnitude of the first reset voltage is greater than the absolute value of the magnitude of the second reset voltage.

3. The resistive memory as claimed in claim 2, wherein:
   during the first reset operation, the control circuit first applies the first reset voltage to the first memory cell and then the verification circuit determines whether the first reset operation was successful,
   in response to the first reset operation not being successful, the control circuit further applies a third reset voltage to the first memory cell.

4. The resistive memory as claimed in claim 3, wherein the absolute value of the magnitude of the third reset voltage is greater than or equal to the absolute value of the magnitude of the first reset voltage.

5. The resistive memory as claimed in claim 1, wherein:
   in a set period, in response to the control circuit applying a set voltage to a second memory cell of the specific cell group and applying an opposite set voltage to the second memory cell,
   after applying the opposite set voltage, in response to the second memory cell not being successfully set, the control circuit sets the flat bit corresponding to the specific cell group to the second flag state.

6. The resistive memory as claimed in claim 5, wherein the second memory cell is the first memory cell.

7. The resistive memory as claimed in claim 5, wherein after applying the opposite set voltage, in response to the second memory cell not being successfully set, the control circuit further applies a second set voltage to the second memory cell.

8. The resistive memory as claimed in claim 7, wherein the second set voltage is higher than the first set voltage.

9. A control method for a resistive memory at least comprising a plurality of cell groups and a plurality of flag bits, wherein each flag bit corresponding to one of the cell groups, comprising:
   selecting a first memory cell of a specific cell group;
   determining whether a specific flag bit corresponding to the specific cell group is in a predetermined flag state;
   in response to determining that the specific flag bit is in the predetermined flag state, performing a first reset operation on the first memory cell; and
   in response to determining that the specific flag bit is not in the predetermined flag state, performing a second reset operation on the first memory cell.

10. The control method as claimed in claim 9, wherein:
    the step of performing the first reset operation at least comprises:
       applying a first reset voltage to the first memory cell;
    the step of performing the second reset operation at least comprises:
       applying a second reset voltage to the first memory cell; and
    the absolute value of the magnitude of the first reset voltage is greater than the absolute value of the magnitude of the second reset voltage.

11. The control method as claimed in claim 10, wherein the step of performing the first reset operation comprises:
    applying the first reset voltage to the first memory cell;
    determining whether the first reset operation was successful;
    in response to determining that the first reset operation was not successful, applying a third reset voltage to the first memory cell.

12. The control method as claimed in claim 11, wherein the absolute value of the magnitude of the third reset voltage is greater than or equal to the absolute value of the magnitude of the first reset voltage.

13. The control method as claimed in claim 9, further comprising:
    during a set period, performing a set operation on a second memory cell of the specific cell group, wherein the step of performing the set operation comprises:
       applying a first set voltage to the second memory cell;
       determining whether the set operation was successful;
       in response to determining that the set operation was not successful, applying an opposite set voltage to the second memory cell and determining again whether the set operation was successful, wherein in response to determining that the set operation was not successful, the flag bit corresponding to the specific cell group is in a second flag state.

14. The control method as claimed in claim 13, wherein after the opposite set voltage is applied to the second memory cell, in response to determining that the second memory cell was not set successfully, a second set voltage is applied to the second memory cell.

15. The control method as claimed in claim 14, wherein the first memory cell and the second memory cell are the same.

16. The control method as claimed in claim 14, wherein the second set voltage is higher than the first set voltage.

* * * * *